(12) United States Patent
Kazami

(10) Patent No.: US 6,242,807 B1
(45) Date of Patent: Jun. 5, 2001

(54) SEMICONDUCTOR INTEGRATED CIRCUIT HAVING HEAT SINKING MEANS FOR HEAT GENERATING WIRES

(75) Inventor: Tetsuo Kazami, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/252,985

(22) Filed: Feb. 19, 1999

(30) Foreign Application Priority Data

Feb. 20, 1998 (JP) .................................................. 10-039049

(51) Int. Cl.⁷ ..................................................... H01L 23/34

(52) U.S. Cl. .......................... 257/758; 257/706; 257/707; 257/718; 257/720

(58) Field of Search .................................... 257/758, 706, 257/707, 718, 720

(56) References Cited

U.S. PATENT DOCUMENTS 5,698,897 * 12/1997 Nashimoto et al. .................. 257/720
5,792,677 *  8/1998 Reddy et al. ........................ 257/720

FOREIGN PATENT DOCUMENTS 54-69394   6/1979  (JP) .
63-78553   4/1988  (JP) .
9-129725   5/1997  (JP) .
9-213696   8/1997  (JP) .

* cited by examiner

Primary Examiner—Fetsum Abraham
(74) Attorney, Agent, or Firm—Sughrue, Mion, Zinn, Macpeak & Seas, PLLC

(57) ABSTRACT

In a semiconductor integrated circuit having a multilayer wiring structure, an electrically nonconnected heat sinking wiring is provided in such a signal wiring layer that heat generation poses a problem. By virtue of this construction, the semiconductor integrated circuit can realize high reliability without increasing the number of steps necessary for the production thereof.

16 Claims, 3 Drawing Sheets

SEMICONDUCTOR INTEGRATED CIRCUIT HAVING HEAT SINKING MEANS FOR HEAT GENERATING WIRES

FIELD OF THE INVENTION

The invention relates to a semiconductor integrated circuit having a multilayer writing structure, and more particularly to a semiconductor integrated circuit that can efficiently remove heat generated in a signal wiring layer located in an upper part of the multilayer structure.

BACKGROUND OF THE INVENTION

In the operation of circuits within LSI (large scale integration) a charge/discharge current for a circuit to drive the capacitance load of a next circuit flows through wiring, causing the wiring to generate heat due to its own resistance. In a major part of conventional semiconductor integrated circuits, the operating frequency is not more than 100 MHz, and the number of signal wiring layers constituting the multilayer wiring structure is two or three. For this reason, heat generation in the wiring has not been significant and hence has posed no serious problem as compared with that in transistors.

In recent years, however, the development of microfabrication techniques, circuits, layout designs and the like of LSI has resulted in rapid advance of an increase in operating speed of circuits, an increase in integration density, and an increase in number of wiring layers constituting multilayer wiring structures. This has led to increased heat generation in the wiring.

In LSI packages of larger power consumption involving significant heat generation, it is common practice to use an LSI cooling method wherein a heat sink or the like is connected to a silicon substrate on its backside and air is blown against the heat sink to cool the LSI. In this case, most of the heat generated from LSI is removed through the silicon substrate underlying the LSI. The heat generated in the wiring is released through two routes, one of which is such that heat is conveyed by the wiring per se and is released into the silicon substrate, and the other is such that heat travels through an interlayer film and is released into the silicon substrate. Therefore, when the wiring is located at an upper position, the distance between this wiring and the underlying silicon substrate is increased and, hence, heat is less likely to be conveyed to the silicon substrate. For this reason, the temperature rise due to heat generation created in the upper wiring is significant particularly in a multilayer wiring structure.

In order to increase the operation rate of the circuit, there is a trend toward an increase in the thickness of interlayer film provided between wiring layers to lower the wiring capacitance. The increased interlayer film thickness, however, increases the distance between the upper wiring layer and the silicon substrate. This accelerates the temperature rise due to heat generation of the wiring.

The increased wiring temperature is likely to create breaking or the like of the wiring due to electromigration, resulting in deteriorated reliability. In general, the deterioration in wiring due to electromigration indexically increases with increasing the temperature. For this reason, avoiding temperature rise of the wiring has become strongly required in the art. Regarding the temperature rise of the wiring, for example, in a five-layer signal wiring layer under certain conditions, experimental data have been reported wherein current flow of about $5 \times 10^5$ A/cm$^2$ in current density J through each signal wiring layer develops a wiring temperature rise of about 90° C. due to heat generation of the wiring per se.

In order to solve the above problems, for example, Japanese Patent Laid-Open No. 129725/1997 discloses a semiconductor integrated circuit. In this conventional semiconductor integrated circuit, a specialty dummy through-hole extending from the uppermost wiring layer to the lowermost wiring layer is provided, and the dummy through-hole is packed with an insulating material having high thermal conductivity to efficiently dissipate heat.

In the conventional semiconductor integrated circuit, the provision of the dummy hole requires, in addition to the provision of the step of producing wiring for constructing a desired circuit, specialty steps, that is, the step of forming a dummy hole for heat dissipation and the step of packing the dummy hole with an insulating material having high thermal conductivity. This increases the number of steps required for the production, posing problems of production cost and the like.

SUMMARY OF THE INVENTION

Accordingly, it is an object of the invention to provide a semiconductor integrated circuit that can remove heat generated in the wiring while preventing an increase in the number of production steps to realize high reliability.

According to the first feature of the invention, a semiconductor integrated circuit having a multilayer wiring structure, comprises: a plurality of signal wiring layers; and an electrically nonconnected heat sink wiring extended from a predetermined wiring layer to a silicon substrate underlying the predetermined signal wiring layer.

Preferably, a PN junction is provided in the silicon substrate in its portion in contact with the heat sinking wiring.

The heat sinking wiring is preferably provided based on the magnitude of a current flowing through the signal wiring layer.

The heat sinking wiring is preferably in contact with the silicon substrate while avoiding the contact of the heat sink wiring with an oxide layer provided on the surface of the silicon substrate.

The predetermined wiring layer is preferably the uppermost signal wiring layer.

The silicon substrate underlying the predetermined signal wiring layer is preferably a silicon substrate as the lowermost layer.

DESCRIPTION OF THE PREFERRED EMBODIMENTS

The semiconductor integrated circuit according to the preferred embodiments of the invention will be explained in conjunction with the accompanying drawings.

First Preferred Embodiment of the Invention

Figure 1:
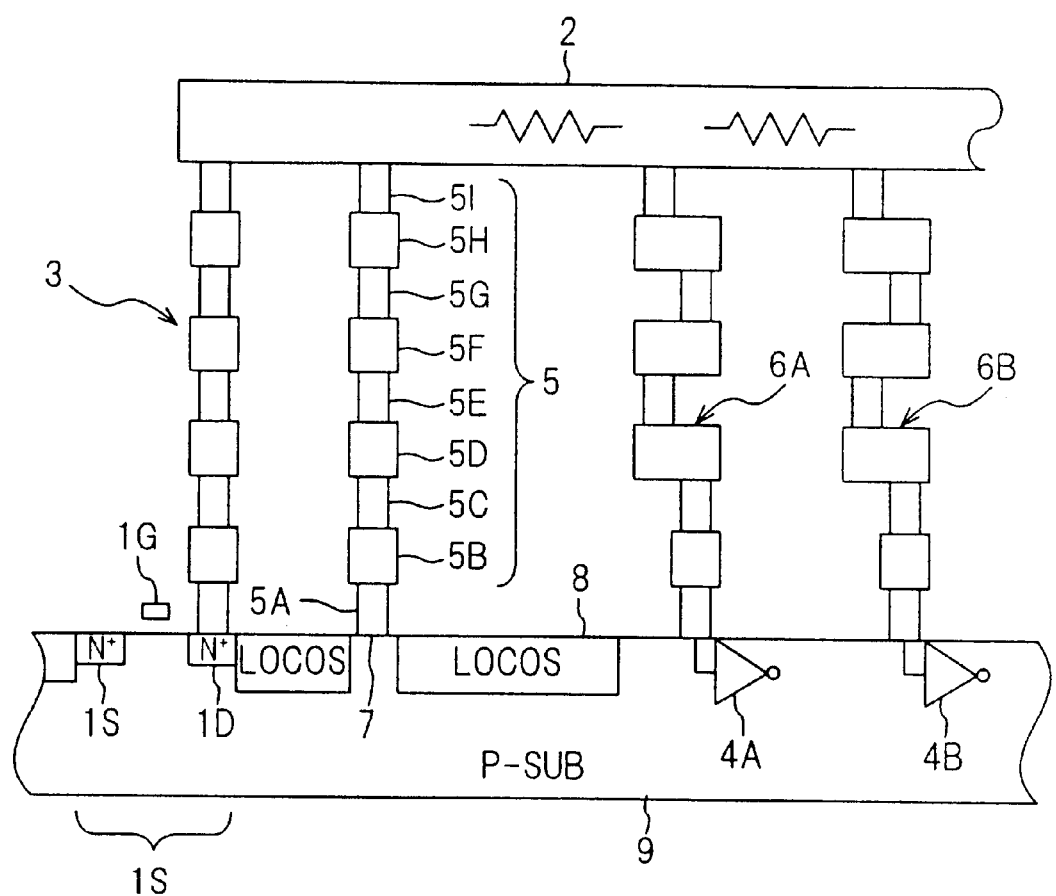
FIG. 1 is a cross-sectional view showing the construction of a semiconductor integrated circuit according to a first preferred embodiment of the invention.

FIG. 1 is a cross-sectional view showing the construction of a semiconductor integrated circuit according to the first preferred embodiment of the invention.

In FIG. 1, numeral 1 designates an N-channel transistor, numeral 1D a drain of the transistor 1, numeral 1G a gate of the transistor 1, numeral 1S a source of the transistor 1, numeral 2 an object signal wiring provided as the fifth layer (uppermost layer), numeral 3 the first to fourth signal wiring layers for feeding a signal from the transistor 1 to the wiring 2, numerals 4A, 4B . . . gates for input of a signal from the wiring 2, and numerals 6A, 6B, . . . wirings for branching and feeding the signal from the wiring 2 in the fifth layer into the gates 4A, 4B . . . . Numeral 5 designates heat sink wiring provided for heat dissipation from the wiring 2 into a P-type silicon substrate 9 that is located at the lowermost position just under the wiring 2.

The heat sink wiring 5 comprises a contact 5A, a first wiring layer 5B, a first-to-second layer through-hole 5C, a second wiring layer 5D, a second-to-third through-hole 5E, a third wiring layer 5F, a third-to-fourth through-hole 5G, a fourth wiring layer 5H, and a fourth-to-fifth layer through-hole 5I that can be formed in the same production process as used in the formation of other wirings. This can avoid an increase in the number of steps for the formation of the heat sink wiring 5, which can prevent an increase in production cost.

A thick field oxide layer 8 called "LOCOS (local oxidation of silicon)" is provided in the P-type silicon substrate 9 in its surface of portions free from the transistor 1. In this preferred embodiment, a contact portion 7 in contact (connection) with the contact 5A on the P-type silicon substrate 9 is not provided with the field oxide layer (LOCOS) 8, and the P-type silicon substrate 9 as such is exposed.

Figure 2A:
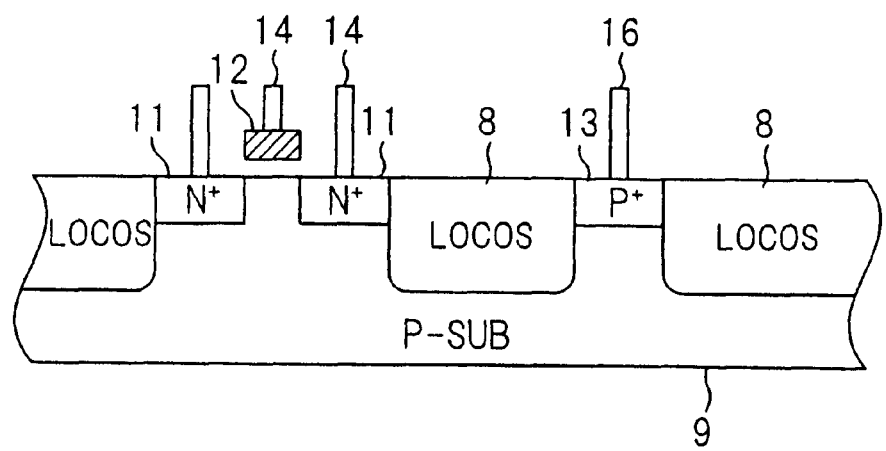
FIG. 2A and 2B are cross-sectional views showing the construction of a silicon substrate with an ordinary CMOS circuit provided thereon.
Figure 2B:
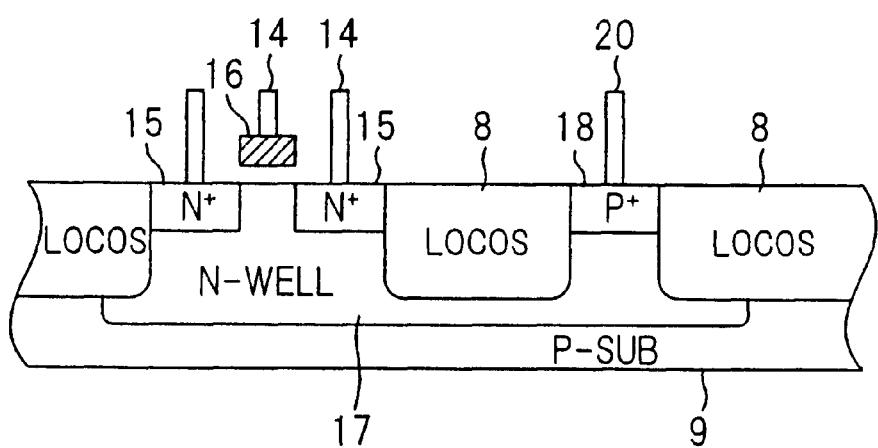

FIG. 2 is a cross-sectional view showing the construction of the P-type silicon substrate 9 with a conventional CMOS circuit provided thereon, wherein FIG. 2(a) is an enlarged view of a region where an N-channel type transistor is provided and FIG. 2(b) is an enlarged view of a region where a P-channel type transistor is provided.

As shown in the drawing, the N-channel transistor comprises: a P-type silicon substrate 9; and, provided on the P-type silicon substrate 9, an N-type diffusion portion (a region with an N-type impurity diffused therein) 11 serving as a source or a drain and a gate 12. A high-concentration P-type diffusion portion (a region with a P-type impurity diffused therein) 13 is provided for supplying substrate potential, and the substrate potential is fed into the high-concentration P-type diffusion portion 13 through the contact 19 from the overlying wiring.

On the other hand, the P-channel transistor comprises: an N-well 17; and, provided within the N-well 17, a P-type diffusion portion 15 serving as a source or a drain and a gate 16. A high-concentration N-type diffusion portion 18 for supplying a potential is provided within the N-well 17. An N-well potential is fed into the high-concentration N-type diffusion portion 18 through the contact 20 from the overlying wiring.

In this case, the reason why the high-concentration P-type diffusion portion 13 is provided on the P-type silicon substrate 9 and the high-concentration N-type diffusion portion 18 is provided within the N-well 17 is to provide ohmic contact between the P-type silicon substrate 9 and the contact 19 and between the N-well 17 and the contact 20.

The field oxide layer 8 is removed from the P-type silicon substrate 9 in its portions of the N-channel MOS transistor and P-channel MOS transistor and its portions where the substrate potential and the N-well potential are fed. In FIGS. 2(a) and (b), numeral 14 designates a contact for the source/drain 11, 15 and for the gates 12, 16.

Figure 3:
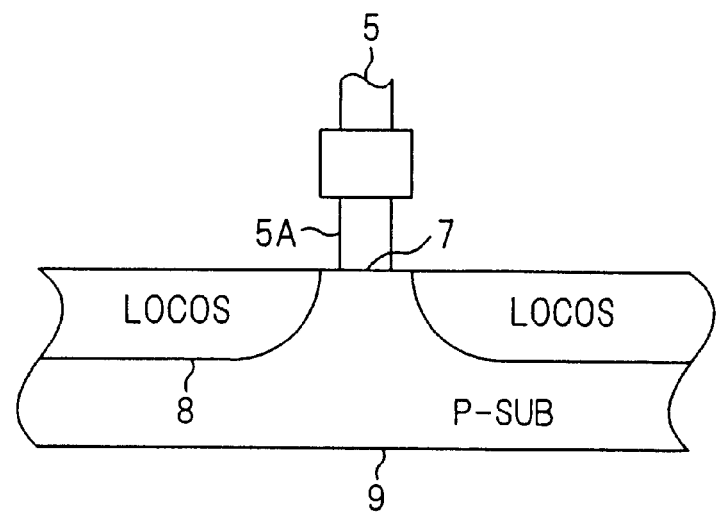
FIG. 3 is an enlarged view of a joint between a heat sink wiring and a silicon substrate according to the first preferred embodiment of the invention.

FIG. 3 is an enlarged view of a contact portion 7 between the wiring 5 for heat dissipation and the P-type silicon substrate 9.

As shown in the drawing, the absence of the field oxide layer (LOCOS) 8 in the contact portion 7 between the contact 5A of the wiring 5 for heat dissipation and the P-type silicon substrate 9 permits a portion, with a low impurity concentration, to come into contact with the contact 5A. For this reason, these contact portions 7 do not have ohmic contact but has high resistance. That is, the wiring and the substrate are electrically in non-contact with each other, but are thermal-conductively in contact with each other. Thus, heat generated from the wiring 2 is removed without significant electrical influence on a signal flowing through the wiring 2.

In the above construction, the removal of heat generated in the wiring 2 will be explained in detail.

A signal is transmitted from a drain 1D of a transistor 1 for an output circuit into gates 4A, 4B, . . . through a wiring 3→a wiring 2→wirings 6A, 6B, . . . . At that time, an AC current for charging/discharging the input gate capacity and the wiring capacitance flows through each wiring. The value of AC current flowing through between the transistor 1 and the wiring 6A to the initial load gate 4A is maximum, and gradually decreases with increasing the number of branchings of the passage, through which the signal flows, that is, branching of the passage into load gates 4A 4B . . . . Accordingly, in this preferred embodiment of the invention, a heat sink wiring 5 passing into the P-type silicon substrate 9 is provided just under the fifth signal wiring 2 (the uppermost wiring layer), in which the self-heat generation due to load current is the maximum value, in the same production process as the conventional wiring and through-hole. The field oxide layer (LOCOS) 8 is removed in the contact portion 7 where the heat dissipation wiring 5 comes into contact with the P-type silicon substrate 9. This permits the contact 5A to come into direct contact with the P-type silicon substrate 9, and consequently provides better thermal conductivity than the thermal conductivity in the case where heat is conveyed through the filed oxide layer (LOCOS) 8.

Thus, the heat generated in the fifth (uppermost) wiring layer 2 is conveyed directly from the heat dissipation wiring 5 to the P-type silicon substrate 9 located just under the fifth wiring layer. Therefore, local temperature rise in the wiring, from which heat is particularly less likely to be dissipated, can be prevented.

In general, the thermal conductivity (unit: $W \cdot m^{-1} \cdot K^{-1}$) of aluminum (Al) wiring, tungsten (w) through-hole, $SiO_2$ interlayer film (LOCOS), and silicon substrate (Si), which are respectively used as the wiring, the through-hole and the interlayer insulating film, is as follows.

Si 168

Al 236

W 177

$SiO_2$ 1.4

As is apparent from these numerical values, even though use is made of the assumption that all the heat dissipation wirings 5 are made of tungsten having lower thermal conductivity than aluminum, the difference between the thermal conductivity of the SiO₂ interlayer film and the thermal conductivity per the area of the tungsten through-hole is not less than 100 times. For this reason, when the SiO₂ interlayer film is not provided, the heat dissipation efficiency can be greatly improved.

Second Preferred Embodiment

The second preferred embodiment is such that an N-type impurity is diffused in the contact portion 7 where the P-type silicon substrate 9 is in contact with the contact 5A of the heat dissipation wiring 5 in the same manner as the production of an N-channel transistor to form an N-type region (an N-type diffusion portion) 10, thereby constructing a PN junction. Only a portion different from the first preferred embodiment will be explained.

Figure 4:
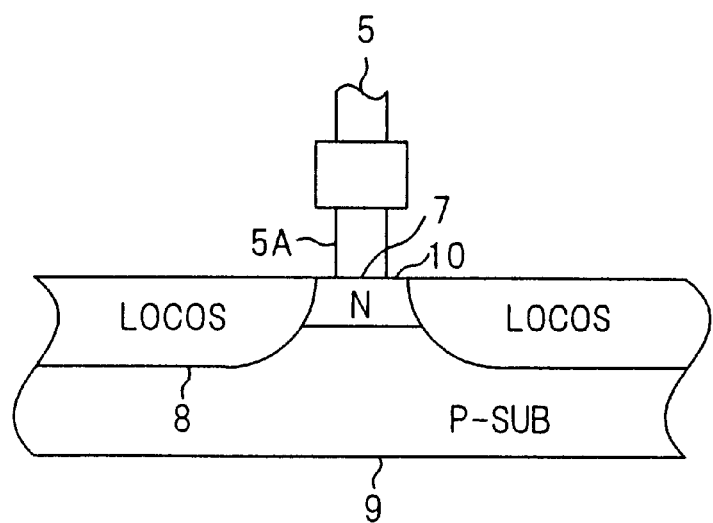
FIG. 4 is an enlarged view of a joint between a heat sink wiring and a silicon substrate according to the second preferred embodiment of the invention.

FIG. 4 is an enlarged view showing the contact portion 7 where the heat dissipation wiring 5 is in contact with the P-type silicon substrate 9 according to the second preferred embodiment of the invention.

When the P-type silicon substrate 9 is used as an ordinary CMOS circuit, a ground potential is provided. Therefore, the PN junction cannot be brought to a forward direction so far as the signal sent from the transistor 1 to the gates 4A, 4B . . . is a positive potential. The coupling between the fifth (uppermost) layer wiring 2 and the P-type silicon substrate 9 is electrically capacitance coupling of the PN junction. Since, however, the junction capacitance of PN junction can be provided as a very small value, the level of the load capacitance of the fifth (uppermost) wiring layer 2 which performs the inherent circuit operation can be ignored. For this reason, heat generated in the fifth (uppermost) wiring layer 2 can be conveyed to the P-type silicon substrate 9 without causing deteriorated performance of operation and the like.

In the above explanation, attention has been drawn to the uppermost wiring only. However, it should be noted that, also in the lower wiring layers, as with the above preferred embodiments of the invention, the heat dissipation wiring may be provided so as to come into contact with the silicon substrate, thus permitting heat generated in the wiring to be directly conveyed to the underlying silicon substrate.

Although the invention has been explained with reference to a construction example comprising a CMOS circuit provided on a P-type silicon substrate, the effect can be attained also in the use of N-type silicon substrate, and constructions other than CMOS circuits, for example, ECL (emitter-coupled logic).

As is apparent from the foregoing description, according to the semiconductor integrated circuit of the present invention, an electrically non-connected heat dissipation wiring is provided extending from a predetermined wiring layer to a silicon substrate underlying the predetermined wiring layer. Heat generated in the overlying signal wiring layer in the semiconductor integrated circuit operated at a high speed can be efficiently dissipated into the silicon substrate. This can prevent a deterioration in wiring due to electromigration and hence can improve the reliability.

Utilization of wiring for heat dissipation purposes eliminates the need to provide any special step for the formation of the heat sink wiring and, since the increase in the number of production steps can be avoided, can prevent an increase in production cost.

The invention has been described in detail with particular reference to preferred embodiments, but it will be understood that variations and modifications can be effected within the scope of the invention as set forth in the appended claims.

What is claimed is:

1. A semiconductor integrated circuit having a multilayer wiring structure, comprising: a plurality of signal wiring layers; and an electrically nonconnected heat sinking wiring extending from a predetermined one of said plurality of signal wiring layers to a silicon substrate underlying the predetermined signal wiring layer, said heat sinking wiring for transferring heat from said predetermined wiring layer to said silicon substrate.

2. The semiconductor integrated circuit according to claim 1, wherein a PN junction is provided in the silicon substrate at a portion which contacts the heat sinking wiring.

3. The semiconductor integrated circuit according to claim 2, wherein the heat sinking wiring is proportionately provided based on the magnitude of current flowing through the signal wiring layer.

4. The semiconductor integrated circuit according to claim 2, wherein the heat sinking wiring is in contact with the silicon substrate while avoiding the contact of the heat sinking wiring with an oxide layer provided on the surface of the silicon substrate.

5. The semiconductor integrated circuit according to claim 2, wherein the predetermined signal wiring layer is the uppermost signal wiring layer.

6. The semiconductor integrated circuit according to claim 2, wherein the silicon substrate underlying the predetermined signal wiring layer is a silicon substrate as the lowermost layer.

7. The semiconductor integrated circuit according to claim 1, wherein the heat sinking wiring is proportionately provided based on the magnitude of a current flowing through the predetermined signal wiring layer.

8. The semiconductor integrated circuit according to claim 3, wherein the heat sinking wiring is in contact with the silicon substrate while avoiding the contact of the heat sinking wiring with an oxide layer provided on the surface of the silicon substrate.

9. The semiconductor integrated circuit according to claim 7, wherein the predetermined signal wiring layer is the uppermost signal wiring layer.

10. The semiconductor integrated circuit according to claim 7, wherein the silicon substrate underlying the predetermined signal wiring layer is a silicon substrate as the lowermost layer.

11. The semiconductor integrated circuit according to claim 1, wherein the heat sinking wiring is in contact with the silicon substrate while avoiding the contact of the heat sinking wiring with an oxide layer provided on the surface of the silicon substrate.

12. The semiconductor integrated circuit according to claim 11, wherein the predetermined signal wiring layer is the uppermost signal wiring layer.

13. The semiconductor integrated circuit according to claim 11, wherein the silicon substrate underlying the predetermined signal wiring layer is a silicon substrate as the lowermost layer.

14. The semiconductor integrated circuit according to claim 1, wherein the predetermined signal wiring layer is the uppermost signal wiring layer with respect to the underlying silicon substrate.

15. The semiconductor integrated circuit according to claim 14, wherein the silicon substrate underlying the predetermined signal wiring layer is a silicon substrate as the lowermost layer.

16. The semiconductor integrated circuit according to claim 1, wherein the silicon substrate underlying the predetermined signal wiring layer is a silicon substrate as the lowermost layer.

* * * * *